ULTRASONIC SOLDERING APPARATUS

Filed Nov. 12, 1964 2 Sheets-Sheet 1

INVENTORS.
GEORGE D. PATRICK,
KENNETH S. ARCHIBALD,

By John N. Hazelwood
ATTORNEY.

ULTRASONIC SOLDERING APPARATUS

Filed Nov. 12, 1964 2 Sheets-Sheet 2

INVENTORS.
GEORGE D. PATRICK,
KENNETH S. ARCHIBALD,
By [signature]
ATTORNEY.

United States Patent Office 3,303,983
Patented Feb. 14, 1967

3,303,983
ULTRASONIC SOLDERING APPARATUS

George D. Patrick, San Diego, and Kenneth S. Archibald, La Mesa, Calif., assignors to General Dynamics Corporation, Pomona, Calif., a corporation of Delaware Filed Nov. 12, 1964, Ser. No. 410,594
9 Claims. (Cl. 228—37)

This invention relates to a soldering apparatus and method, particularly to an apparatus and method for applying solder to a sheet of insulating material having a plurality of electrical conductors disposed on a surface of the sheet, and more particularly to a soldering apparatus and method utilizing high frequency vibration to form standing waves and cavitation in the molten solder flowing against the connectors for oxide removal and wetting of the connectors.

Various forms of soldering devices have been proposed and utilized for soldering electrical and mechanical portions of circuit boards, especially circuit boards of the so-called printed circuit type. A common type of printed circuit comprises a sheet of electrically insulating material such as a phenolic board, carrying on one surface a plurality of electrical conductors in the form of thin, flat strips integrally united to the insulating material. The printed circuit is completed by mounting on the outer surface of the insulating sheet a number of components and connecting them, by means of leads extending through holes in the insulating material, to the electrical conductors. There is a considerable problem in making these connections rapidly, efficiently, and effectively.

In view of the highly competitive field concerned with the manufacture of printed circuits for use in all types of electrical and electronic equipment, it is desirable to provide automatic apparatus which is capable of soldering all of the connections of a printed circuit substantially simultaneously. One technique for soldering all such connections simultaneously is that of dip-soldering; while another, more recently developed, is that of pumping molten solder through tubes to form a fountain of molten solder at the positions where solder is desired. Also, use of a transverse solder wave has been tried.

The dip soldering technique has undesirable limitations and disadvantages which include: (1) the formation of oxide and impurities which float on the surface of the molten solder bath which cause poorly soldered circuits; (2) the periodic removal of the oxide and impurities; (3) the blistering of the insulating board and damage of the circuit components mounted thereon due to the substantial amount of heat absorbed by the board during the partial immersion in the solder bath; (4) the printed circuits must be maintained perfectly flat when they are engaged with the solder bath in order that the entire surface will be soldered; (5) flux or flux gases may be trapped during soldering, causing poor soldering; (6) the speed of removal of the printed circuit from the solder bath must be relatively slow in order to prevent excessive amounts of solder from adhering to the metal circuits in the form of tears or icicles; and (7) the additional cleaning steps required before and after dipping.

The technique of moving the circuit boards over a fountain of molten solder has greatly reduced the problems involved in dip soldering. However, considerable difficulty has been experienced with shorts and other circuit problems arising from icicles or tears of hardened solder. Also, spidering or undesirable soldering connections causing bridging of separate conductors has occurred with the known apparatus for carrying out this technique. Additionally, these prior art techniques failed to eliminate gas pockets, voids, oxides and other foreign material in the solder joints. The U.S. Patents 3,039,185 to W. L. Oates and 3,041,991 to H. A. Dvorak exemplify the prior art molten solder fountain technique.

This invention overcomes the limitations and disadvantages of the prior art devices by providing means for the elimination of gas pockets, voids, oxides and other foreign material in the solder due to the novel features of forming a fountain of molten solder and inducing ultrasonic energy into this fountain to produce cavitation wherein a scrubbing action is imparted to the inserted circuit board removing oxides and allowing rapid and complete wetting of the exposed metals.

Therefore, it is an object of this invention to provide an apparatus and method for soldering lead wires of electrical components to printed circuit boards.

A further object of the invention is to provide an apparatus and method for rapidly soldering desired interconnections on a circuit board in such a manner as to minimize formation of icicles or interconnecting bridges of solder.

Another object of the invention is to provide an apparatus and method for minimizing circuit board warpage due to the absorption of heat during the soldering period.

Another object of the invention is to provide an apparatus and method for oxide removal and wetting of the exposed metals during soldering.

Another object of the invention is to provide a soldering apparatus and method which utilizes ultrasonic energy to produce cavitation in the molten solder.

Other objects, not specifically set forth, will become readily apparent from the following description and drawings wherein.

The invention broadly relates to a method and apparatus for soldering circuit boards. The system contemplates forming a fountain of solder by pumping molten solder up a manifold, through a slotted element which lies on top of the manifold and toward the workpiece. A frequency generator is provided in the system which acts upon the slotted element so as to form standing waves and cavitation in the molten solder flowing therethrough. The provision of the high frequency generating means in the system facilitates oxide removal and wetting of the exposed metals and generally aids in securing quality soldered connections.

Figures 1, 2, 3:
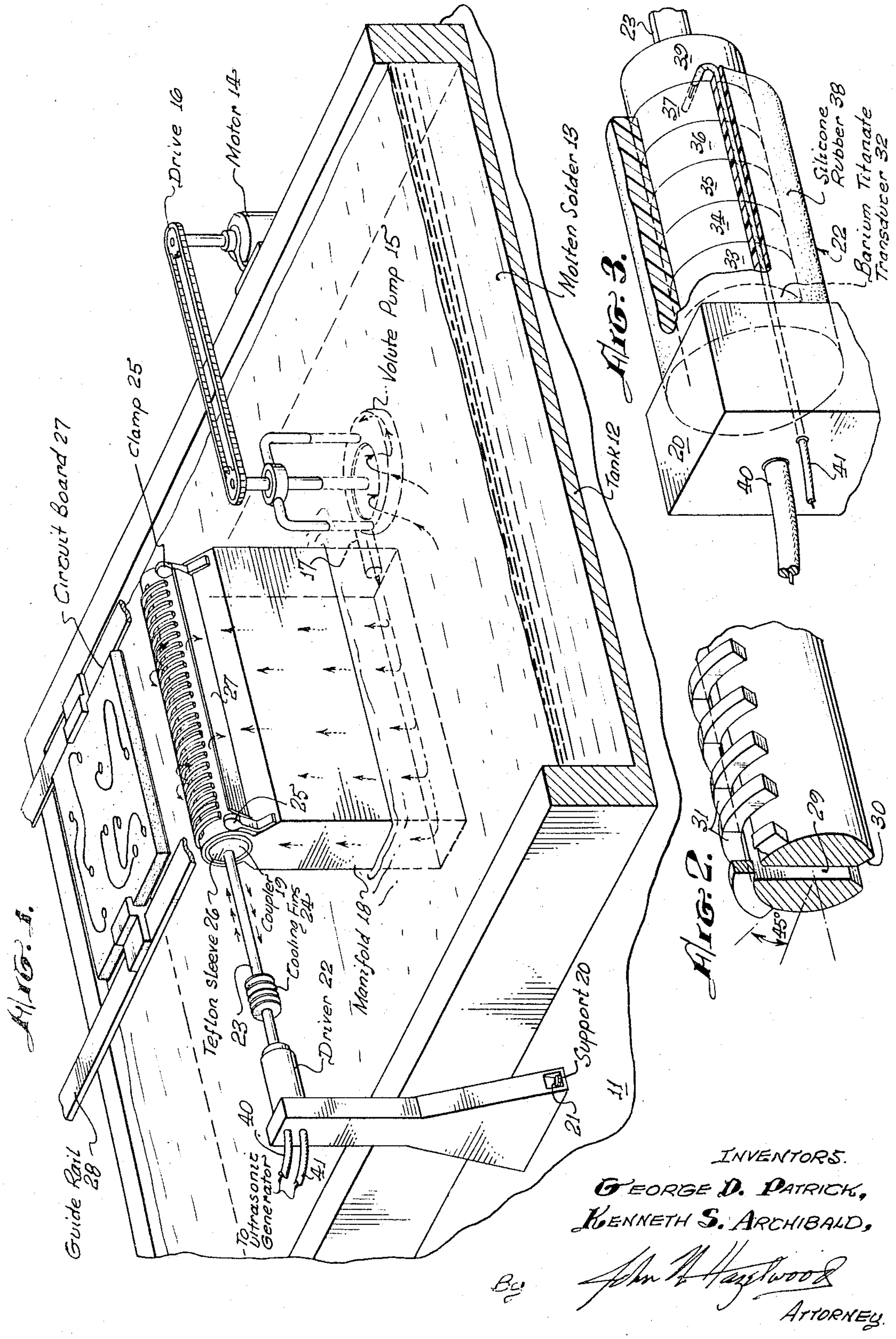
FIG. 1 is a schematic view of an embodiment of the apparatus for carrying out the invention.
FIG. 2 is a partial enlarged view of the coupler unit of the FIG. 1 apparatus.
FIG. 3 is an enlarged view, partially in section, of the ultrasonic driver unit of the FIG. 1 apparatus.

Referring now to the drawings, there is shown in FIG. 1 base 11 supporting a vat or tank 12 containing molten solder 13. A motor 14 attached to tank 12 drives a volute pump 15 through a drive 16 to force molten solder from tank 12 through pump outlet tube 17 into a container or manifold 18 and out the upper end through an elongated nozzle or coupler unit 19 which lies in a trough on the top of manifold 18 and extends the width of the manifold. A support 20 is fixed to base 11 by means such as bolts 21 and supports an ultrasonic driver 22, driven by an ultrasonic generator as indicated by legend which is drivingly connected to coupler unit 19 through a shaft 23, shaft 23 being provided with cooling fins 24. Coupler unit 19 is retained on manifold 18 by a pair of clamps indicated at 25. A Teflon sleeve 26 (only one shown) is positioned around each end of coupler unit 19, said sleeves 26 abutting clamps 25. A baffle member 27 (only one shown) positioned between clamps 25 is located on each side of coupler unit 19 to retard the flow of molten solder from unit 19. A circuit board 27 is shown supported on a guide rail 28, board 27 being movable over coupler unit 19 by hand or by known mechanism such as that taught in the above cited U.S. patents.

The coupler unit 19 (see FIG. 2) is provided with slot 29 having a diverging lower portion 30 which is located in the trough portion of manifold 18. A plurality of spaced fins 31 extend across slot 29. In this embodiment, fins 31 are approximately 1/8 inch in depth and terminate approximately 45 degrees from the transverse horizontal plane of the coupler unit 19.

The ultrasonic driver 22 of this embodiment comprises a stack of six barium titanate transducers 32, 33, 34, 35, 36 and 37 mounted in a silicone rubber sleeve or casing 38 and retained therein by silver filled epoxy. Casing 38 is operatively attached to support 20 in any conventional manner. The transducer 37 is connected to a coupling element 39 by means such as silver filled epoxy, coupling element 39 being connected to shaft 23. The transducers 32–37 of driver 22 are excited by the ultrasonic generator through connectors 40 and 41, connectors 40 and 41 being connected to transducers 32 and 37, respectively, such as by bonding. Connector 41 extends through silicone rubber casing 38.

Figure 4:
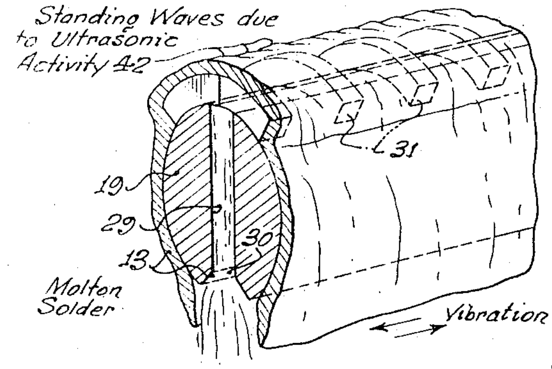
FIG. 4 is a partial enlarged view of the FIG. 1 coupler unit showing the standing waves of the molten solder due to ultrasonic activity.

FIG. 4 shows the flow pattern of the molten solder 13 as it is forced through slots 29 in coupler unit 19 and over fins 31 forming standing waves 42 due to ultrasonic activity created by vibration of coupler unit 19 in the direction indicated by arrows in FIGS. 1 and 4 due to the excited transducers of ultrasonic driver 22.

Figures 5, 6:
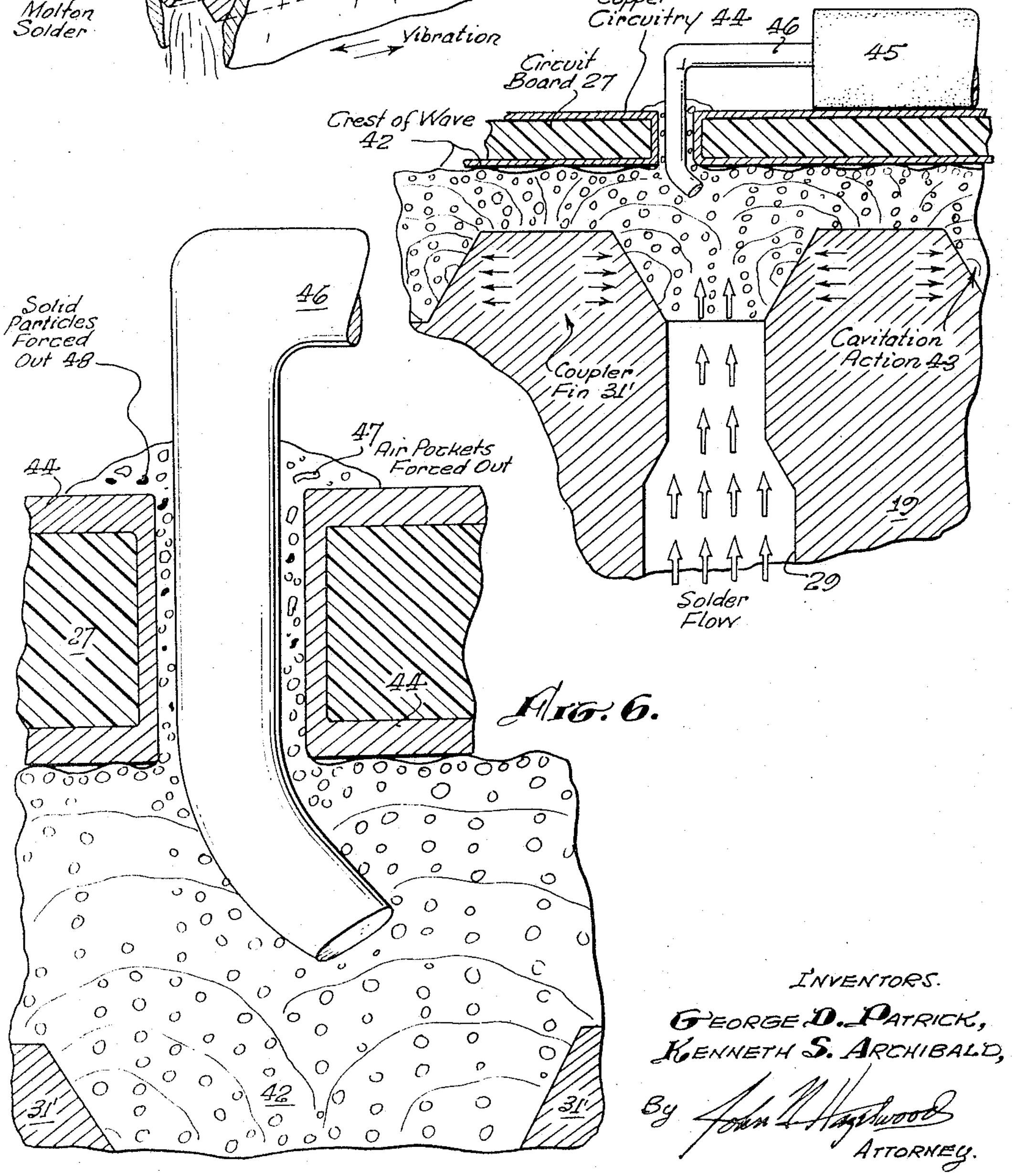
FIG. 5 is an enlarged view showing the cavitation action of the molten solder and utilizing a modification of the coupler unit.
FIG. 6 is an enlarged view of the solder flow around an electrical connector positioned in a circuit board.

FIGS. 5 and 6 show the cavitation action at 43 of the molten solder 13 on circuit board 27 when it is inserted into the crest of the standing waves 42. Board 27 is provided with copper circuitry 44 and an electronic component 45 attached to board 27 in the conventional manner, component 45 having a lead 46 extending through an aperture in board 27 which is to be soldered to its copper circuit. As shown in FIG. 6 trapped air pockets 47 and foreign materials or solid particles 48 are worked loose, up, and out of the aperture in board 27, making a perfectly clear homogeneous solder bond between the lead 46 and the circuit plating 44. The cavitation action created by coupler unit 19 when driven by ultrasonic driver 22 imparts a scrubbing action to the copper circuit 44, removing oxides and allowing rapid and complete wetting thereof, thus eliminating the need for the application of fluxes and surface preparation prior to soldering as required by the prior art methods.

The dip soldering technique had many steps involving surface preparation, including the removal of surface oils, oxides and dirt. During assembly, care had to be taken to keep the precleaned board free from oils and foreign particles. With the cavitation flow soldering technique of this invention, the assembly time on both single and double-sided circuit boards is greatly reduced, due to the ability of the cavitation action to fracture oxides and contaminants on the metal surfaces and allow complete fusion of these metals to the solder without the aid of numerous board preparations. This results in a more reliable circuit board at a substantially lower cost than boards produced by the known prior art methods.

It has thus been shown that this invention overcomes the disadvantages of the prior known soldering methods and apparatus in the soldering of components and conductors, especially with respect to printed circuit boards.

While the invention has been illustrated and described utilizing an ultrasonic driver, it is within the scope of this invention to utilize drivers which operate in other and different frequency ranges, for example, sonically.

Although a particular embodiment of the apparatus for carrying out the invention has been illustrated and described, modifications thereof will become readily apparent to those skilled in the art, and it is intended to cover in the appended claims all such modifications as comes within the spirit and scope of the invention.

What we claim is:

1. A soldering device comprising a base, a tank mounted on the base, a manifold extending from the tank and in communication with solder within the tank, a coupler unit operatively mounted on said manifold and having a plurality of spaced ribs operatively connected thereto, said coupler unit having a horizontally-disposed elongated orifice opening above the manifold for attaining a vertical sheet-like fountain of solder above the surface of said spaced ribs, pump means positioned within said tank and connected to said manifold for forcing solder through the elongated orifice in said coupler unit, and a high frequency transducer unit operatively connected to said coupler unit for producing standing waves in said vertical sheet-like fountain of solder.

2. The soldering device defined in claim 1, including mechanism adapted to pass a circuit board across the crest of the standing waves of solder produced by the high frequency transducer unit.

3. A soldering device for producing cavitation action of molten solder which fractures oxides and contaminants on metal surfaces and allows complete fusion of the metals to the solder comprising: an elongated nozzle-like means having a plurality of spaced fin-like members mounted on the upper side thereof, means for forcing molten solder through said nozzle-like means, and high frequency drive means operatively connected to said nozzle-like means for vibrating the latter and producing standing waves of molten solder above said fin-like members.

4. The soldering device defined in claim 3, additionally including mechanism adapted to pass a circuit board having mounted components to be soldered across the crest of the standing waves of molten solder, whereby the cavitation action of the molten solder produced by vibrating the nozzle-like means fractures oxides and contaminants on the metal surfaces of the circuit board and mounted components and forces air pockets and foreign material out of the soldered area.

5. In a soldering device comprising a tank, a manifold mounted in said tank, means for pumping solder from said tank through said manifold for forming a fountain of solder above said manifold, the improvement comprising: an elongated member operatively mounted on the top of said manifold, said elongated member having a nozzle-like opening extending substantially across the upper surface thereof and a plurality of spaced rib-like members extending transversely of said nozzle-like opening, and means for ultrasonically vibrating said elongated member for producing standing waves of solder above said rib-like members.

6. The soldering device defined in claim 5, including mechanisms adapted to move an element to be soldered across the crest of the standing waves of solder, whereby the cavitation action of the solder due to the ultrasonic vibration functions for oxide removal and wetting of the element being moved across the standing waves of solder.

7. The soldering device defined in claim 5, wherein said ultrasonic vibrator means includes a driver unit comprising a plurality of transducers adapted to be driven by an ultrasonic generator.

8. In a fountain type soldering mechanism, the improvement comprising: a coupler unit positioned in a fountain of solder, said unit having an elongated nozzle member therein through which solder is adapted to pass and a plurality of fin-like members extending across said elongated nozzle member, and means for ultrasonically vibrating said coupler unit for producing standing waves of solder above said fin-like members.

9. The soldering mechanism defined in claim 8, additionally including mechanism adapted to pass an element to be soldered over the crest of the standing waves, whereby the cavitation action of the solder produced by the ultrasonic vibration of the coupler unit serves to remove oxide from and wet the surface to be soldered, to force the air pockets and foreign particles from the solder, and allow complete fusion of the surfaces being soldered.

References Cited by the Examiner

UNITED STATES PATENTS

| | | | |
|---|---|---|---|
| 2,824,543 | 2/1958 | Brown | 29—503 |
| 2,984,903 | 5/1961 | Dixon et al. | 29—503 |
| 3,029,766 | 4/1962 | Jones | 29—470 |
| 3,081,535 | 3/1963 | Lincoln | 228—37 |
| 3,084,650 | 4/1963 | Johns | 29—503 |
| 3,249,281 | 5/1966 | St. Jean | 228—37 |
| 3,266,136 | 8/1966 | Gutbier | 29—503 |

FOREIGN PATENTS

| | | |
|---|---|---|
| 856,961 | 9/1960 | Great Britain. |
| 891,193 | 3/1962 | Great Britain. |

JOHN F. CAMPBELL, *Primary Examiner.*

M. L. FAIGUS, *Assistant Examiner.*